US008866947B2

(12) United States Patent
Lenchenkov

(10) Patent No.: US 8,866,947 B2
(45) Date of Patent: Oct. 21, 2014

(54) DOUBLE PASS BACK SIDE IMAGE SENSOR SYSTEMS AND METHODS

(75) Inventor: Victor Lenchenkov, Sunnyvale, CA (US)

(73) Assignee: Aptina Imaging Corporation, George Town (KY)

( * ) Notice: Subject to any disclaimer, the term of this patent is extended or adjusted under 35 U.S.C. 154(b) by 378 days.

(21) Appl. No.: 13/198,188

(22) Filed: Aug. 4, 2011

(65) Prior Publication Data

US 2012/0281099 A1 Nov. 8, 2012

Related U.S. Application Data

(60) Provisional application No. 61/481,448, filed on May 2, 2011.

(51) Int. Cl.
H04N 3/14 (2006.01)
H04N 5/335 (2011.01)
H01L 27/146 (2006.01)
H04N 17/00 (2006.01)

(52) U.S. Cl.
CPC .... *H01L 27/14629* (2013.01); *H01L 27/14603* (2013.01); *H01L 27/14685* (2013.01); *H04N 17/002* (2013.01)
USPC ........... 348/294; 348/298; 348/302; 348/308; 348/312

(58) Field of Classification Search
USPC .......................... 348/294, 298, 302, 308, 312; 250/208.1; 257/290–292
See application file for complete search history.

(56) References Cited

U.S. PATENT DOCUMENTS

| 6,756,618 | B2* | 6/2004 | Hong | 257/292 |
| 7,675,024 | B2 | 3/2010 | Lenchenkov | |
| 7,683,305 | B2 | 3/2010 | Solhusvik | |
| 7,880,168 | B2 | 2/2011 | Lenchenkov | |
| 8,325,241 | B2* | 12/2012 | Yoshioka | 348/207.99 |
| 8,389,921 | B2* | 3/2013 | Nozaki et al. | 250/208.1 |
| 2005/0109917 | A1* | 5/2005 | Wong | 250/208.1 |
| 2009/0194671 | A1* | 8/2009 | Nozaki et al. | 250/208.1 |
| 2011/0032398 | A1 | 2/2011 | Lenchenkov | |

* cited by examiner

*Primary Examiner* — Yogesh Aggarwal
(74) *Attorney, Agent, or Firm* — Kendall P. Woodruff

(57) ABSTRACT

Double pass back side image (BSI) sensor systems and methods are disclosed. The BSI sensor may include a substrate, pixel reflectors formed on the substrate, and pixel photodiodes fabricated in the substrate, each pixel photodiode positioned over a respective one of the pixel reflectors. Micro-lenses may be formed over each photodiode and an image filter may be formed between the photodiodes and the micro-lenses. The pixels reflectors, photodiodes, micro-lenses, and filter may be formed using CMOS fabrication.

23 Claims, 5 Drawing Sheets

DOUBLE PASS BACK SIDE IMAGE SENSOR SYSTEMS AND METHODS

CROSS REFERENCE TO RELATED APPLICATIONS

This application claims priority from U.S. Provisional Patent Application Ser. No. 61/481,448 filed May 2, 2011, entitled MONOCHROME-COLOR DOUBLE PASS BACK SIDE IMAGE SENSOR, the contents of which are incorporated fully herein by reference.

BACKGROUND OF THE INVENTION

Image sensors convert optical light to electrical signals. Conventional image sensors are commonly used in electronic devices such as cellular telephones, computers, and digital cameras. Image sensors are formed from an array of photodetectors, each of which converts received light into an electrical signal. The effectiveness of a photodetector at converting received light into an electrical signal is the Quantum Efficiency (QE) of the photodetector.

Conventional image sensors are formed at two separate fabrication plants. The conventional image sensor is initially processed at a plant that uses complementary metal-oxide-semiconductor (CMOS) transistor fabrication techniques. The conventional image sensor is then sent to a color filter array (CFA) plant.

At the CMOS plant, photodiodes that convert light into electrical signals are manufactured in a silicon substrate. Interconnect layers used for wiring transistors are fabricated on top of the photodiodes and the substrate. Above the interconnect layers, a passivation layer that insulates the transistors and interconnect layers from external contamination is then deposited. When the CMOS process is complete, the conventional image sensor is transferred to the CFA plant for additional processing.

At the CFA plant, a color filter array is formed on top of the passivation layer. The color filter array includes tiles incorporating various colored dyes for color filtering. An example of a CFA pattern that may be used is the GREG (green-red-blue-green) Bayer pattern. After the color filter array is in place, an array of microlenses is formed on top of the color filter array.

A disadvantage of a conventional image sensor of this type is that the image sensor requires manufacturing processes that are implemented at two separate fabrication plants. This requirement can increase processing complexity and cost. Conventional image sensors may also be prone to contamination from the dye of the color filter array, which results in loss of efficiency, sensitivity, and reliability. It is desirable to provide improved image sensors.

BRIEF DESCRIPTION OF THE DRAWINGS

The invention is best understood from the following detailed description when read in connection with the accompanying drawings, with like elements having the same reference numerals. When a plurality of similar elements are present, a single reference numeral may be assigned to the plurality of similar elements with a small letter designation referring to specific elements. When referring to the elements collectively or to a non-specific one or more of the elements, the small letter designation may be dropped. According to common practice, the various features of the drawings are not drawn to scale unless otherwise indicated. To the contrary, the dimensions of the various features may be expanded or reduced for clarity. Included in the drawings are the following figures.

DETAILED DESCRIPTION OF THE INVENTION

Figure 1:
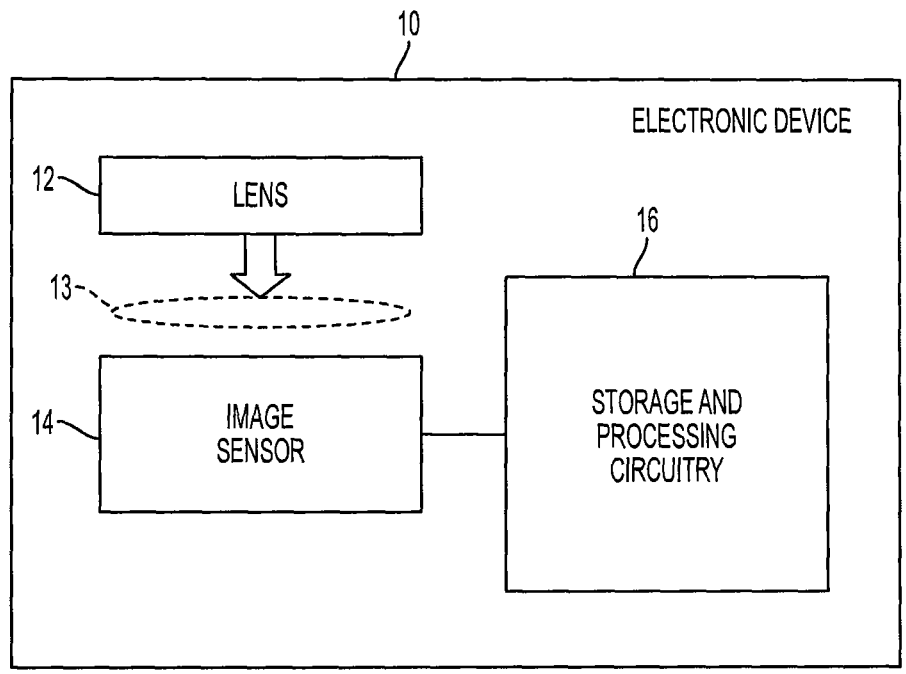
FIG. 1 is a block diagram of an electronic device in accordance with aspects of the present invention.

An image sensor can be used with any type of electronic device used for imaging, such as a digital camera, a cellular telephone, medical equipment, a computer, or any other imaging device. A high-level block diagram for such an electronic device is shown in FIG. 1. Electronic device 10 may include lens 12, image sensor 14, and storage and processing circuitry 16. Lens 12 may be used to focus light onto image sensor 14. Image sensor 14 has an array of image pixels with which sensor 14 generates data corresponding to an image. The image pixels may be connected similarly to those in U.S. Pat. No. 6,140,630 to Rhodes, the contents of which are incorporated fully herein by reference for their teaching on the structure and operation of image sensor arrays. Image data can be stored at storage and processing circuitry 16 for future retrieval. Storage and processing circuitry 16 may include circuitry that controls image sensor 14 and circuitry that implements other functions for electronic device 10.

In one embodiment, an optional transparent layer 13 (sometimes referred to as a cover glass layer) is positioned between lens 12 and image sensor 14, e.g., as a coating on the lens 12. In another embodiment, the optional transparent layer may be formed on a side of the lens 12 facing away from the image sensor 14. Transparent layer 13 may include a filter layer such as a monochrome filter. Transparent layer 13 may be packaged with image sensor 14 to form a camera module.

Figure 2:
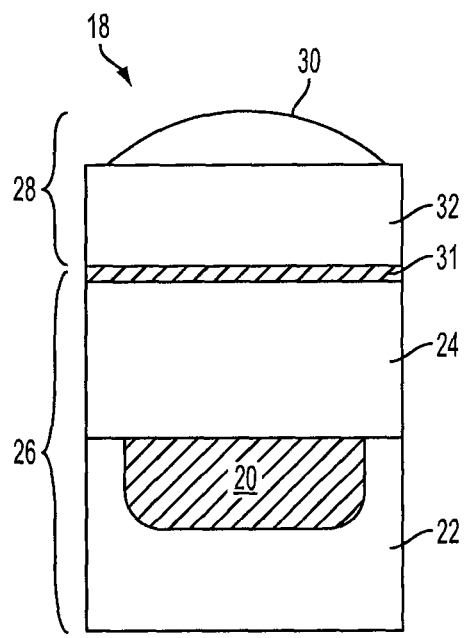
FIG. 2 is a cross-sectional side view of a conventional image pixel.

The cross-sectional side view of a conventional image pixel 18 is shown in FIG. 2. A photodiode 20 is fabricated in silicon substrate 22. On top of photodiode 20 are interconnect layers 24 that are used to route signals to complementary metal-oxide-semiconductor (CMOS) transistors. On top of interconnect layers 24 is a layer of silicon nitride 31 that is used to insulate the transistors from contamination. Components 20, 22, 24, and 31 form a pixel structure 26 that may be manufactured using CMOS technology at a CMOS plant.

Pixel structure 26 may then be transferred to a color filter array (CFA) plant to attach a color filter array including filter tiles such as color filter 32. Microlens 30 is formed on top of color filter 32. The color filter array includes tiles of various colors for color filtering. Microlens 30 is used to concentrate incoming light onto photodiode 20. Color filter 32 and microlens 30 make up portion 28 of conventional image pixel 18.

Figure 3A:
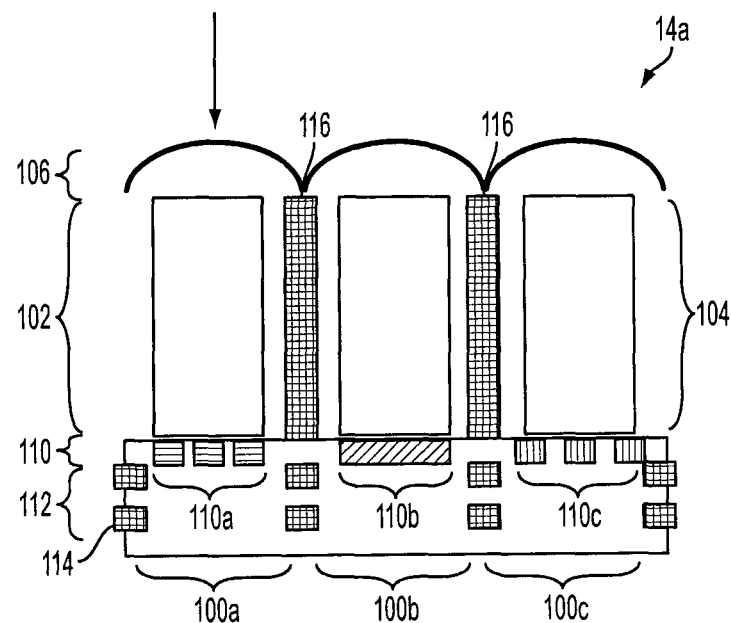
FIGS. 3A, 3B, and 3C are illustrations of image pixels in accordance with aspects of the present invention.
Figure 3B:
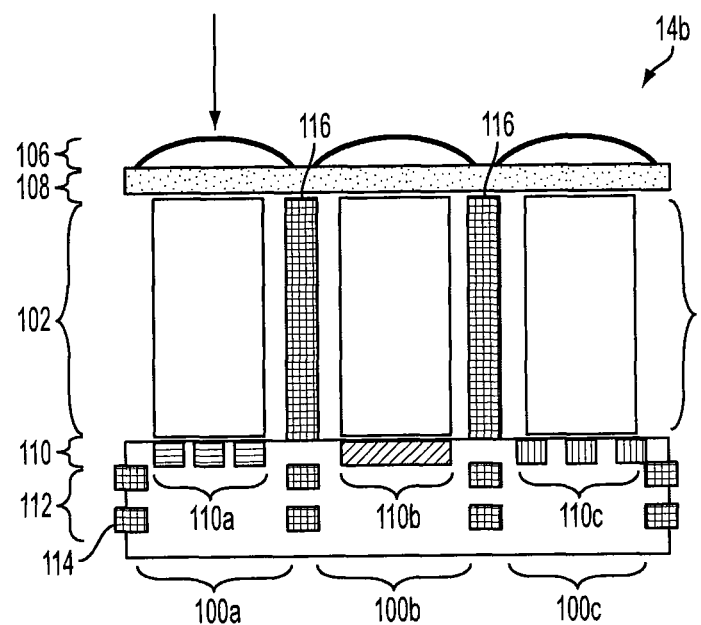
Figure 3C:
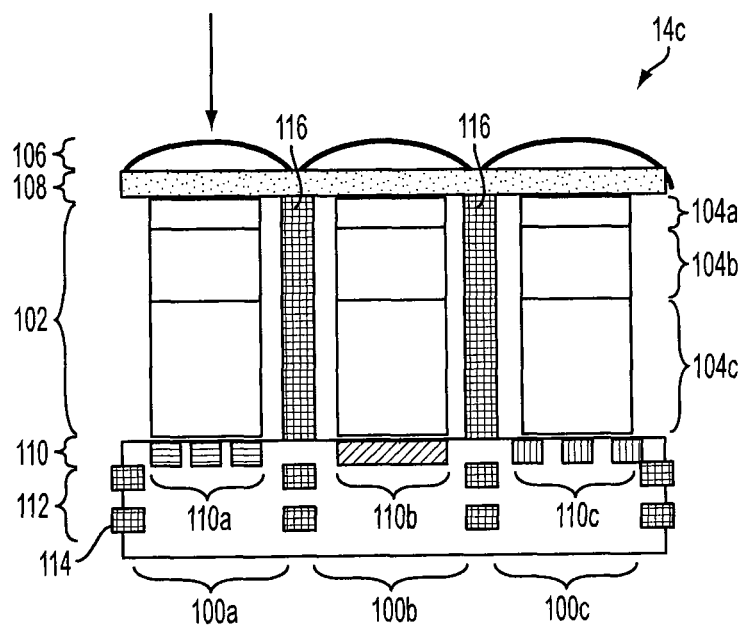

Details of embodiments of the image sensor 14 of FIG. 1 are shown in FIGS. 3A-3C. Light passing through lens 12 can be focused on image sensor 14. Image sensor 14 includes image pixels 100 formed in a two-dimensional array. A cross-sectional view of three image pixels 100a, b, and c in accordance with three embodiments are respectively illustrated in FIGS. 3A-3C. Each image pixel 100 includes at least one photodiode 104 (e.g., an n– doped region) formed within a substrate 102. Substrate 102 may be a silicon substrate, germanium substrate, a silicon-on-insulator substrate, or a substrate formed from other elements or combination of elements. Microlenses 106 can be formed over photodiodes 104 and substrate 102. Each microlens 106 can be associated with a respective image pixel 100 and may be used to concentrate incoming light into the photodiode 104 of that image pixel.

Pixel reflectors 110 are adjacent the photodiodes 104. The pixel reflectors 110 reflect light passing through the photodiodes 104 in a first direction in a second direction that is substantially opposite so that the light passes back though the photodiodes 104. This double pass of light through the photodiodes 104 allows more of the light to be captured by the photodiode and converted, thereby improving the QE of the image pixels 100. By positioning the reflective elements at the base of the photodiodes 104, the photodiodes can be used to determine color levels (as described in detail below) without the need for color filters positioned over the photodiodes 104. Because the color filters are not positioned over the photodiodes, more light is able to enter the photodiodes, thereby further improving the QE of the image pixels.

Interconnect layers 112 are formed adjacent the pixel reflectors 110. The interconnect layers 112 include electrical traces such as electrical trace 114 connecting the photodiodes 104 within the image sensor 14 to the storage and processing circuitry 16 in order to read out voltages from the photodiodes. Additionally, barrier regions 116 (e.g., p+ boron doped regions) may be formed between photodiodes 104 of adjacent image pixels 100 to prevent cross talk.

FIGS. 3A-3C depict three different kinds of pixel reflectors 110. A first image pixel 100a includes a color pixel reflector 110a that reflects a first color (e.g., green). A second image pixel 100b includes a monochrome pixel reflector 110b that reflects all colors. A third image pixel 100c includes a color pixel reflector 110c that reflects a second color (e.g., red). The pixel reflectors may be patterned polycrystalline silicon (polysilicon) layers (i.e., photonic bandgap filters) formed on the semiconductor 102. The color pixel reflectors 100a, c may be, for example, interference filters for different colors that include alternating layers of low/high index materials for example polySi/SiO2. Multiple layers of material having different refractive indexes may be deposited to form diffraction gratings that are tuned to reflect light in a particular wavelength band. Interference filters may be designed to selectively transmit portions of the light, while reflecting certain wavelength ranges. In this way, interference filters may be used to generate image pixels 100 that are sensitive to predetermined wavelength ranges of light. An image sensor 14 (FIG. 1) may include a set of image pixels 100a including pixel reflector bandgap filters for a first color, a set of image pixels 100c including pixel reflector bandgap filters for a second color, and a set of image pixels 100b including pixel reflector monochrome filters.

FIGS. 3B and 3C depict image pixels 100 with a filter 108 positioned between the photodiodes 104 and the micro lenses 106. The image pixels 100 depicted in FIG. 3A do not include such a filter 108. The filter 108 may be an interference filter. A pair of unpatterned notch filter that absorbs light only in two very specific locations (e.g., wavelengths between the red/green wavelengths and between the green/blue wavelengths) may be used to improve light transmission. Because the filter is unpatterned, there is no light diffraction problem, which improves spatial resolution and reduces optical cross talk due to color filter patterning.

FIG. 3C depicts image pixels 100 with photodiodes 104 that each include multiple photodiode regions 104a-c. In an embodiment each of the multiple photodiode regions 104a-c is optimized for different wavelength of light. For example, region 104a may be optimized to collect mainly blue light (400-450 nm), region 104b may be optimized to collect mainly green light (450-500 nm), and region 104c may be optimized to collect mainly red light (550-650 nm).

In an embodiment, the depth of each region is designed to have at least about the same signal levels if illuminated with the same blue, red and green light levels. For example, 400 nm deep for photodiode region 104a (for blue assignment), 800 nm deep for photodiode region 104b (for green assignment), and 1800 nm for photodiode region 104c (for red assignment); making total photodiode depth equal to 3 micrometers (um). Other photodiode region depths may also be used. For example, photodiode region 104a may be 300 nm deep, photodiode region 104b may be 600 nm deep, and photodiode region 104c may be 1200 nm deep. Appropriate photodiode region depth will be understood by one of skill in the art from the description herein.

Image sensors with arrays of image pixels 100 of the type shown in FIGS. 3A-3C can be fabricated at a single CMOS plant because these pixels do not require additional (non-CMOS) processing to form dye-based color filter tiles. CMOS-based image sensors may exhibit fewer contamination issues than image sensors based on pigments or dyes. Fully CMOS-technology compatible image sensors may also provide cost savings. A CMOS image sensor can be fabricated in one fabrication plant and need not be transferred to another facility for color filter array and microlens processing. The dielectric elements of pixels in CMOS image sensors may also be able to withstand sun exposure and high temperatures better than optical elements based on organic materials commonly used in conventional dye-based filters.

Figure 4:
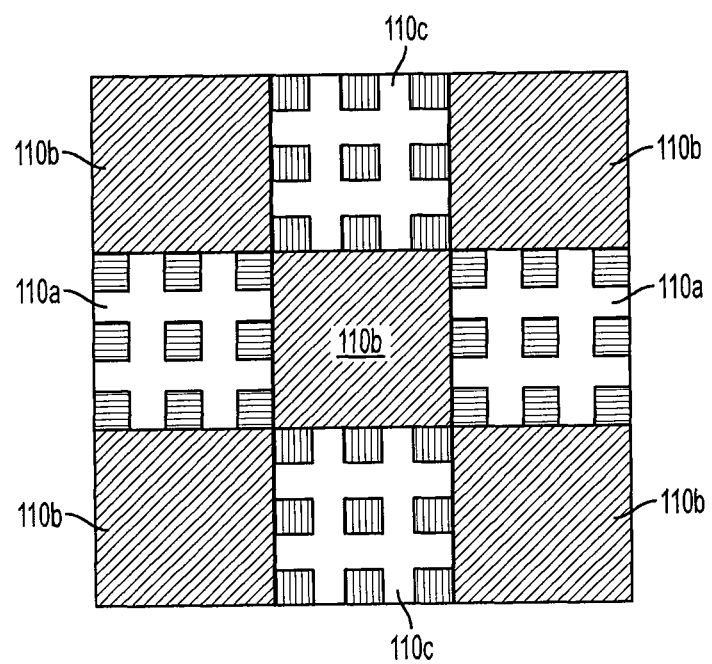
FIG. 4 is an illustration of a pixel pattern in accordance with aspects of the present invention.

FIG. 4 depicts a layout of the pixel reflectors 110a-c of the image pixels 100 within image sensor 14 in accordance with one embodiment. In the illustrated embodiment, each color pixel reflector 110a, c is separated within each row and column by a monochrome pixel reflector 110b. The pixel reflectors 110 may be arranged in overlapping groups of five pixel reflectors 110, the signals from which can be combined to determine color levels as described below with reference to FIG. 5. In the illustrated embodiment, the group of five pixel reflectors includes the central monochrome pixel reflector 110b and the four adjacent color pixel reflectors 110a, c.

Figure 5:
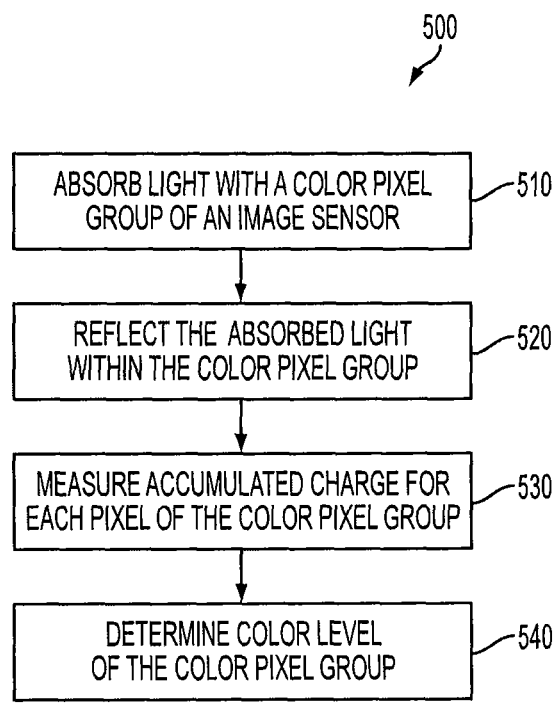
FIG. 5 is a flowchart of a method for determining color level for a color pixel group in accordance with aspects of the present invention.

FIG. 5 shows an example method 500 for converting absorbed light into an electrical signal with an image sensor in accordance with aspects of the present invention. Method 500 may desirably be implemented, for example, with a CMOS image sensor. As a general overview, method 500 includes absorbing light with a photodetector and reflecting the absorbed light. Additional details of method 500 are described herein with respect to the components of image sensor 14 and image pixel 100.

In step 510, light is absorbed by photodetectors of a group of image pixels. In an example embodiment, the group of image pixels include two image pixels 100a with pixel reflectors 110a for a first color (e.g., green), an image pixel 100b with a monochrome reflector 110b, and two image pixels 100c with pixel reflectors 110c for a second color (e.g., red). The light may be filtered (e.g., by filter 13 and/or 108) and/or focused (e.g., by lens 12 and micro lenses 106) prior to entering the photodetectors. The absorbed light includes all wavelengths of interest (e.g., visible light including a red component "R," a green component "G," and a blue component "B") not filtered out by the filters and lenses. In embodiments where the photodiodes include multiple photodiode regions 104a-c such as illustrated in FIG. 3C, each of the multiple photodiode regions 104a-c may be optimized to absorb a different wavelength of light.

In step 520, the absorbed light of each photodiode is selectively reflected after passing through the photodiodes for a second pass. In an example embodiment, the two image pixels 100a with pixel reflectors 110a for a first color (e.g., G) reflect the first color and allow other wavelengths of light to pass, the two image pixels 100c with pixel reflectors 110c for a second color (e.g., R) reflect the second color and allow other wavelengths of light to pass, and the image pixel 100b with a monochrome reflector 110b reflects all wavelengths of interest (e.g., RGB)

In step 530, accumulated charge for each pixel of the color pixel group is measured for the absorbed and reflected light. In an example embodiment, the light entering each image pixel 100 includes all wavelengths of light and, thus, the measured accumulated charge for the initial pass corresponds to all frequencies (e.g., RGB). For reflected light, the monochrome reflective element 110b reflects all wavelengths of interest and, thus, the measured charge for the second/reflected pass through image pixels 100b also corresponds to all frequencies (e.g., RGB). The image pixels 100a with pixel reflectors 110a for a first color (e.g., G) reflect only that color and, thus, the measured charge for the second/reflected pass through image pixels 100a corresponds to only that frequency (e.g., G). Likewise, the image pixels 100c with pixel reflectors 110c for a second color (e.g., R) reflect only that color and, thus, the measured charge for the second/reflected pass through image pixels 100c corresponds to only that frequency (e.g., R).

In step 540, a color level is determined for the color pixel group. In an example, the monochrome image pixel 100b absorbs three components of light on a first pass (e.g., R1, G1, and B1, with the numeral 1 representing a first pass though the photodiodes) and absorbs three components of light on a second pass (e.g., R2, G2, and B2, with the numeral 2 representing a second/reflected pass though the photodiodes). The first color image pixel 100a absorbs three components of light on a first pass (e.g., R1, G1, and B1), but is only able to absorb what is reflected on a second pass (e.g., G2). Likewise, the second color image pixel 100c absorbs three components of light on a first pass (e.g., R1, G1, and B1), but is only able to absorb what is reflected on a second pass (e.g., R2). Thus, the color contribution of the monochrome image pixel, the two first color image pixels, and the two second color image pixel can be represented as shown in equations (1), (2), (3), (4), and (5), respectively, below:

$$\text{Monochrome\_Pixel\_Signal} = B1 + G1 + R1 + B2 + G2 + R2 \quad (1)$$

$$\text{LeftGreen\_Signal} = B1 + G1 + R1 + G2 \quad (2)$$

$$\text{UpperRed\_Signal} = B1 + G1 + R1 + R2 \quad (3)$$

$$\text{RightGreen\_Signal} = B1 + G1 + R1 + G2 \quad (4)$$

$$\text{LowerRed\_Signal} = B1 + G1 + R1 + R2 \quad (5)$$

The following three equations with three unknown can then be formed:

$$\text{Signal}(1) - \text{Signal}(3) = G2 + B2 \quad (6)$$

$$\text{Signal}(1) - \text{Signal}(2) = R2 + B2 \quad (7)$$

$$\text{Signal}(4) - \text{Signal}(5) = G2 - R2 \quad (8)$$

Since there are three equations (equations (6), (7), and (8)) with three unknown, the numerical value for R2, G2, and B2 can be determined. The determined values can then be substituted into equations (1)-(5), which can then be solved to yield R1, G1, and B1. Thus, three color components can be determined using image pixels with just two color reflective elements and one monochrome reflective element.

The scheme for color assignment can be modified for any arbitrary color scheme not just RGB as described above. The scheme may be implemented as an iterative spatially variable process which take place before and after iterative color assignment. A color correction matrix can become spatially variable (e.g., dependent on image height–position of the pixel relative to the center of array where image height is 0% while at the corner of array image height is 100%.

Figure 6:
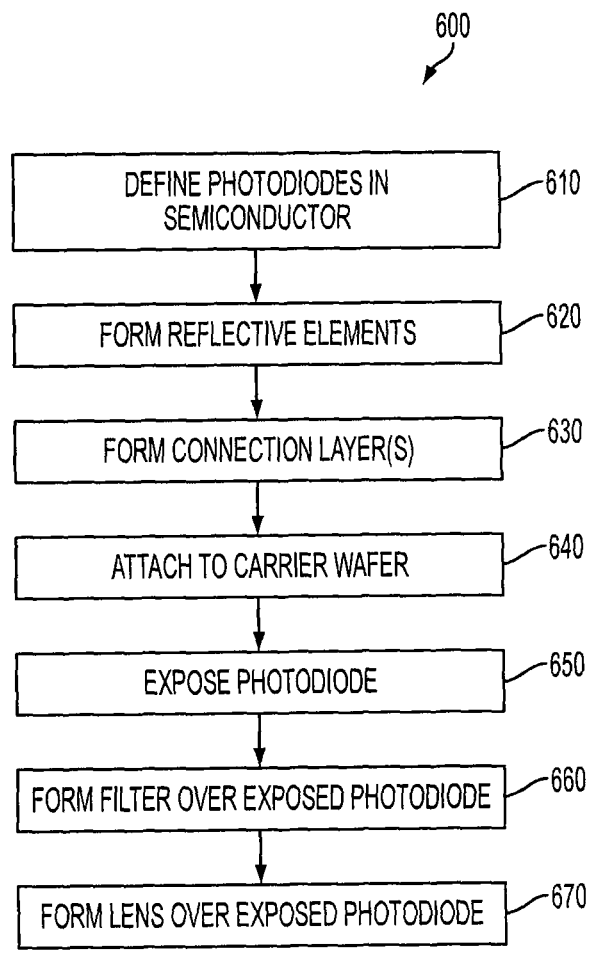
FIG. 6 is a flowchart of a method for forming a image pixel in accordance with aspects of the present invention.

FIG. 6 shows an example method 600 for fabricating an array of image pixels in accordance with an aspect of the invention. In step 610, photodiodes are defined in a semiconductor. In an embodiment, photodiodes 104 may be formed using an n– dopant to create an n– region. A p-type dopant such as Boron may be used to provide a p+ barrier region 116 between the photodiodes. The photodiodes 104 may be approximately 2 micrometers (um) deep.

In step 620, reflective elements are formed on the photodiodes. In an embodiment, the reflective elements 110a-c may be monochrome and color selective filters (e.g., polysilicon bandgap filters or diffraction gratings) printed on the photodiodes using a CMOS fabrication technique.

In step 630, a connection layer is formed over the reflective elements. In an embodiment, the connection layer 112 includes metal circuitry printed on the reflective elements using a CMOS fabrication technique.

In step 640, the connection layer is attached to a carrier wafer (not shown). In an embodiment, the carrier wafer is a silicon wafer that is thermally bonded to the connection layer 112.

In step 650, the photodiode is exposed. In an embodiment, a side of the semiconductor 102 facing away from the carrier wafer is removed to expose the photodiodes using conventional CMOS fabrication techniques.

In step 660, an optional filter is formed over the exposed photodiode. In an embodiment, a filter 108 is formed by coating the entire semiconductor with the exposed photodiodes with a filter using conventional CMOS fabrication techniques.

In step 670, an optional microlens is formed over each exposed photodiode. In an embodiment, a microlens 106 is printed over each photodiode (and filter 108 if present) using conventional CMOS fabrication techniques.

Although the invention is illustrated and described herein with reference to specific embodiments, the invention is not intended to be limited to the details shown. Rather, various modifications may be made in the details within the scope and range of equivalents of the claims and without departing from the invention. For example, although the example embodiments disclosed herein are particularly suitable for use in conjunction with complementary metal-oxide-semiconductor (CMOS) image sensors, it will be understood by one of ordinary skill in the art that the invention is not so limited.

What is claimed:

1. An image sensor comprising:
a substrate;
a plurality of pixel reflectors formed on the substrate; and
a plurality of pixel photodiodes fabricated in the substrate, each pixel photodiode positioned over a respective one of the plurality of pixel reflectors, wherein the plurality of pixel reflectors include a first set of pixel reflective bandgap filters for a first color and a second set of pixel reflective bandgap filters for a second color.

2. The sensor of claim 1, further comprising:
a plurality of pixel micro-lenses formed on the substrate, each micro-lens fabricated over a respective one of the plurality of pixel photodiodes.

3. The sensor of claim 2, further comprising:
a monochrome filter fabricated on the substrate, the monochrome filter positioned between the plurality of pixel photodiodes and the plurality of pixel micro-lenses.

4. The sensor of claim 3, wherein the plurality of pixel reflectors, the plurality of pixel photodiodes, the plurality of pixel micro-lenses, the monochrome filter are formed using CMOS fabrication.

5. The sensor of claim 1, wherein the plurality of pixel reflectors further include a third set of pixel monochrome reflectors.

6. The sensor of claim 5, wherein the first set of pixel reflective bandgap filters, the second set of pixel reflective bandgap filters, and the third set of pixel monochrome reflectors are patterned polycrystalline silicon.

7. The sensor of claim 1, wherein the first color is green and the second color is red.

8. The sensor of claim 5, wherein the plurality of pixel reflectors are grouped into overlapping pixel groups with each group including at least one reflective bandgap filter from the first set of pixel reflective bandgap filters for the first color, at least one reflective bandgap filter from the second set of pixel reflective bandgap filters for the second color, and at least one reflector from the third set of pixel monochrome reflectors.

9. The sensor of claim 8, wherein each group includes two bandgap filters from the first set of pixel reflective bandgap filters for the first color, two bandgap filters from the second set of pixel reflective bandgap filters for the second color, and one bandgap filter from the third set of pixel monochrome reflectors.

10. The sensor of claim 1, wherein:
light entering the sensor passes through the plurality of pixel photodiodes in a first direction, is reflected by the plurality of pixel reflectors, and passes through the plurality of pixel photodiodes in a second direction substantially opposite the first direction.

11. An electronic device comprising:
the sensor of claim 1; and
an image lens adjacent the sensor that is positioned to focus light from an image on the sensor.

12. The device of claim 11, further comprising:
a monochrome image filter positioned between the image lens and the sensor.

13. The device of claim 12, wherein the monochrome image filter is a coating on a surface of the image lens.

14. The device of claim 12, wherein the monochrome image filter is formed using CMOS fabrication.

15. The device of claim 11, wherein the lens has a first surface and a second surface opposite the first surface, the first surface facing the substrate, and the device further comprises:
a monochrome image filter positioned adjacent the second surface of the lens.

16. The device of claim 11, wherein the device is a camera.

17. A method for determining a color level for a color pixel group of an image sensor, the method comprising:
absorbing light within a color pixel group of an image sensor;
reflecting the absorbed light within the color pixel group;
measuring accumulated charge for each pixel of the color pixel group resulting from the absorbed and reflected light; and
determining a color level for the color pixel group based on the measured charge for each pixel.

18. The method of claim 17, wherein each color pixel group includes two color reflecting pixels of a first color, two color reflecting pixels of a second color, and one monochrome reflecting pixel, and wherein the determining step comprises:
subtracting measured charge for one of the two color reflecting pixels of the first color from the measured charge for the monochrome reflecting pixel;
subtracting measured charge for one of the two color reflecting pixels of the second color from the measured charge for the monochrome reflecting pixel; and
subtracting measured charge for an other one of the two color reflecting pixels of the first color from the measured charge for an other one of the two color reflecting pixels of the second color;
determining a first color level for the first color, a second color level for the second color, and a third color level for a third color different from the first and second color based on the subtracted measured charge.

19. A method for forming a photodiode including a plurality of pixels, the method comprising:
defining a plurality of photodiodes on a first side of a semiconductor;
forming pixel reflectors over each of the defined photodiodes;
forming at least one connection layer over the pixel reflectors;
removing a portion of a second side of the semiconductor to expose the defined photodiodes; and
forming an unpatterned filter over the exposed photodiodes.

20. The method of claim 19, wherein the unpatterned filter comprises an unpatterned notch filter.

21. The method of claim 19, further comprising:
forming a micro lens over each of the exposed photodiodes.

22. The method of claim 19, wherein the defining the plurality of photodiodes includes:
defining a first photodiode optimized for a first wavelength of light;
defining a second photodiode over the first photodiode, the second photodiode optimized for a second wavelength of light different than the first wavelength of light; and
defining a third photodiode over the second photodiode, the third photodiode optimized for a third wavelength of light different than the first and second wavelengths of light.

23. The method of claim 21, wherein the forming steps are preformed using CMOS fabrication.

* * * * *